United States Patent [19]

Narabu et al.

[11] Patent Number: 5,029,190
[45] Date of Patent: Jul. 2, 1991

[54] OUTPUT CIRCUIT HAVING HIGH CHARGE TO VOLTAGE CONVERSION GAIN

[75] Inventors: Tadakuni Narabu; Masaharu Hamasaki; Tetsuya Iizuka, all of Kanagawa, Japan

[73] Assignee: Sony Corporaiton, Tokyo, Japan

[21] Appl. No.: 502,688

[22] Filed: Apr. 2, 1990

[30] Foreign Application Priority Data

Mar. 31, 1989 [JP] Japan .................................. 1-83689

[51] Int. Cl.⁵ ..................... G11C 19/28; H01L 29/78; H03F 3/16; H03F 1/10
[52] U.S. Cl. ...................................... 377/60; 357/24; 330/277; 330/292
[58] Field of Search ....................... 357/24; 377/57–63; 330/156, 277, 292; 307/358, 359, 491, 548, 568

[56] References Cited

U.S. PATENT DOCUMENTS 4,556,851 12/1985 Levine .................................... 377/60
4,811,371 3/1989 Tower .................................... 377/60

Primary Examiner—Gene M. Munson
Attorney, Agent, or Firm—Hill, Van Santen, Steadman & Simpson

[57] ABSTRACT

An output circuit for CCD imager devices or CCD delay devices is disclosed in which a depletion type second MIS transistor is connected to the drain side of a first MIS transistor constituting a source follower adapted for converting transferred signal signals into an electrical voltage, and an output voltage is supplied to the gate of the second MIS transistor. This depletion type second MIS transistor causes the drain potential of the first MIS transistor to be changed in phase with the input electrical charges to reduce the gate-to-drain capacitance of the first MIS transistor to improve the charge-to-voltage conversion gain.

9 Claims, 5 Drawing Sheets

OUTPUT CIRCUIT HAVING HIGH CHARGE TO VOLTAGE CONVERSION GAIN

BACKGROUND OF THE INVENTION (1) Field of the Invention

This invention relates to an output circuit for converting input charges into electrical voltage. More particularly, it relates to an output circuit, such as an initial stage output buffer of a charge transfer device, such as CCD imaging device or CCD delay device.

(2) Description of the Prior Art

In CCD imaging or CCD delay devices, an output circuit for outputting signal charges is formed on a chip for converting minute input electrical charges into electrical voltage.

FIG. 1 shows an example of a customary output circuit in which a transfer electrode 102 for transferring electrical charges and an output gate 103 are formed on a substrate 101. A floating diffusion region 104 for storage of signal charges is disposed between the output gate 103 and a precharging gate 105 and connected to a gate of an nMOS transistor 106 constituting an initial stage source follower of the output circuit. With this initial stage source follower, a ground voltage GND is applied via a constant current source 107 to the source of the nMOS transistor 106, the drain of which is supplied with a source voltage $V_{DD}$. The output of this initial stage source follower is provided from the source of nMOS transistor 106 and input to the gate of an nMOS transistor 108 constituting the next stage buffer. A constant current source 109 is similarly connected to the source of the nMOS transistor 108, from which an output signal $V_{out}$ is provided.

There is also known a prior art device in which the floating diffusion region 104 is replaced by a floating gate from which electrical charges are supplied to a source follower so as to be converted into an electrical voltage.

In these output circuits, conversion from minute electrical charges into electrical voltage is carried out and, the larger the charge to voltage conversion gain, the higher is the S/N ratio of the circuit.

Meanwhile, from the well-known relation $Q=V \times C$, where V represents electrical voltage, Q electrical charges and C electrical capacitance, an output circuit with a lesser electrical capacitance is preferred because lesser electrical charges suffice to produce desired electrical voltage.

Above all, as shown in FIG. 2, the following relation $$C_{tot} = C_{FD} + C_S + C_{GD}$$

where $C_{tot}$ represents total capacitance, $C_{FD}$ the capacitance between the floating diffusion region and the substrate, $C_s$ the wiring capacity and $C_{GD}$ the gate-to-drain capacitance of the nMOS transistor, holds from the floating diffusion region 110 to the first stage source follower nMOS transistor 111. Above all, it is required from circuit characteristics to reduce the capacitance $C_{GD}$ which depends upon the gain-to-drain overlap of the nMOS transistor which is supplied with a signal $V_{sig}$.

SUMMARY OF THE INVENTION

It is an object of the present invention to provide an output circuit for converting input electrical charges into an electrical voltage, wherein the gate-to-drain capacitance of a first stage transistor of the output circuit is reduced to improve its electrical charge-to-voltage conversion gain.

The output circuit of the present invention includes a first MIS transistor having its gate supplied with input electrical charges and constituting a source follower for outputting a voltage signal converted from input electrical charges, which have been derived from a floating diffusion region or a floating gate. A constant current source may be connected to the source of the first MIS transistor and a load may be connected between the constant current source and an electrical source connected to the constant current source. To the drain side of the first MIS transistor is connected a depletion type or normally-on second MIS transistor, by means of which the electrical power is supplied from the electrical source to the source follower. This second MOS transistor has its gate connected to the output section of the source follower, that is to the source of the first MIS transistor. Thus the output signal of the second MIS transistor is changed in phase with the input signal, so that the drain level of the first MIS transistor follows level shifts of the gate of the first MIS transistor to reduce parasitic capacitance to improve its charge-to-voltage conversion gain.

It is also possible with the output circuit of the present invention to set the potential of the source of the first or second MIS transistor so as to be equal to the substrate potential inclusive of the well potential.

DETAILED DESCRIPTION OF THE INVENTION

Figure 1:
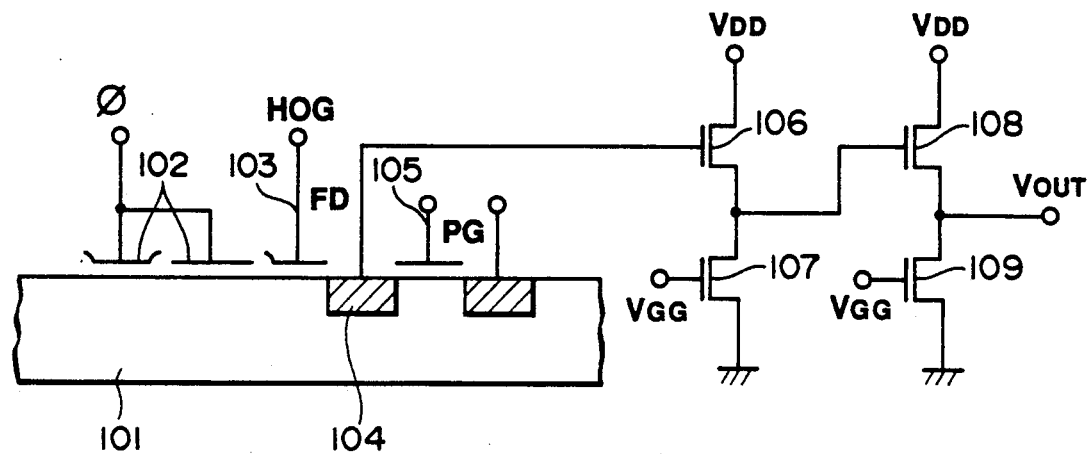
FIG. 1 is a circuit diagram showing an example of an output circuit of a customary CCD.
Figure 2:
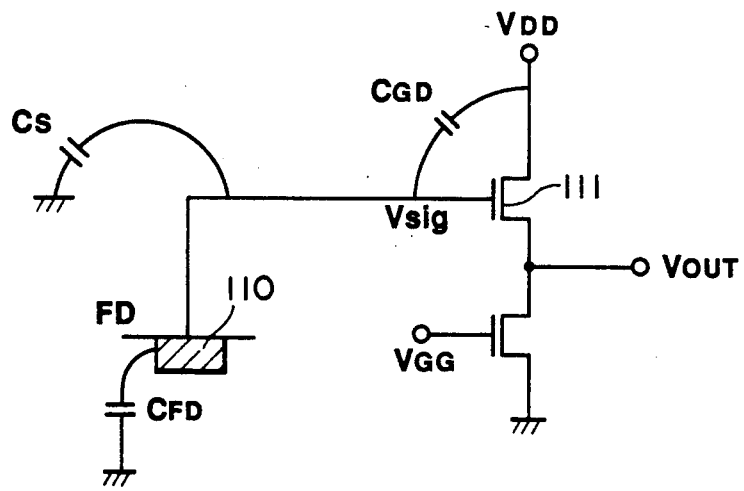
FIG. 2 is a circuit diagram showing essential portions of an example of the output circuit shown in FIG. 1.

By referring to the drawings, certain preferred embodiments of the present invention will be explained in detail.

First Embodiment

The present embodiment is directed to an output circuit formed on a CCD chip.

Figure 3:
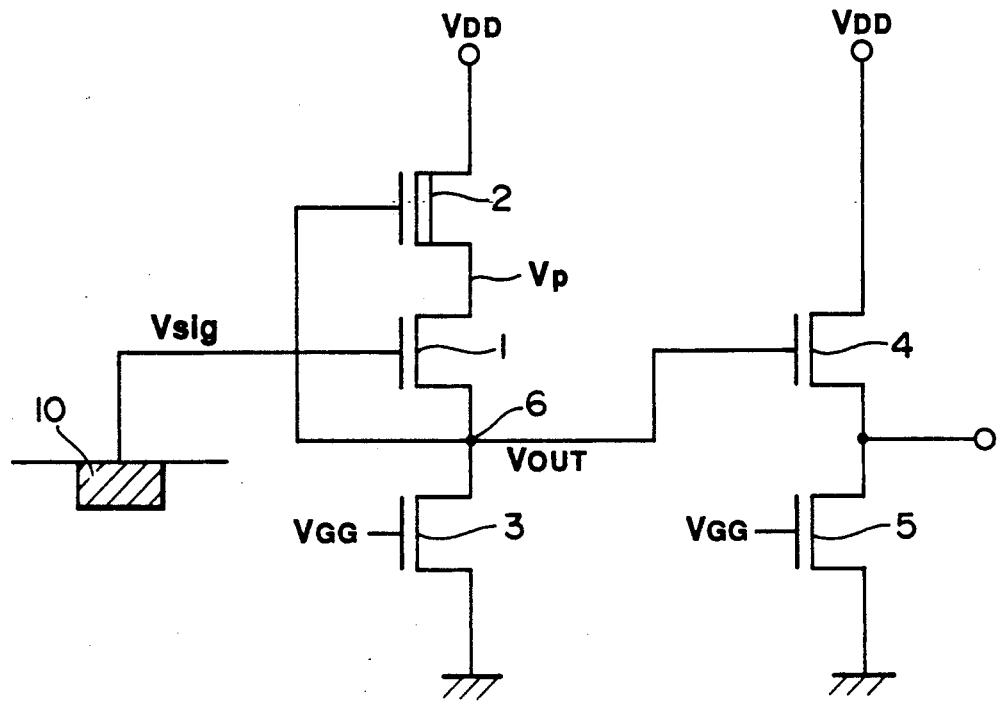
FIG. 3 is a circuit showing an embodiment of the output circuit according to the present invention.

FIG. 3 shows a circuit organization of the present embodiment, wherein an nMOS transistor 1, which is a first MIS transistor constituting a source follower, has its gate connected to a floating diffusion region 10, which is provided at an end of a charge transfer section, not shown. The nMOS transistor 1 has its gate supplied with input electrical charges from the floating diffusion region 10. The source of the nMOS transistor 1 represents an output section 6 of the first stage source follower and is connected to the gate of an nMOS transistor 4 constituting the next stage source follower. An nMOS transistor 3 functioning as a constant current source is connected between the source of nMOS transistor 1 and the ground voltage GND. A constant voltage $V_{GG}$ is supplied to the gate of the nMOS transistor 3.

The nMOS transistor 1 has its drain connected to the source of an nMOS transistor 2 which is a depletion type second MIS transistor. A source voltage $V_{DD}$ is supplied to the drain of this depletion type nMOS transistor 2, the gate of which is connected to the source of the nMOS transistor 1, that is the output section 6 of the source follower.

The next stage source follower is comprised of nMOS transistors 4, 5, and the nMOS transistor 4 having its gate connected to the output section 6 of the first stage source follower has its drain supplied with the source voltage $V_{DD}$, whereas the nMOS transistor 5 has its source supplied with the ground voltage GND while having its gate supplied with the constant voltage $V_{GG}$. An output signal is provided the source of nMOS transistor 4.

With the above described output circuit of the present illustrative embodiment, a voltage $V_p$ at the source of the nMOS transistor 2 may be changed responsive to changes in the input voltage $V_{sig}$ which is the gate voltage of the nMOS transistor 1. That is, the nMOS transistor 1 is caused to act as the source follower, at the same time that the nMOS transistor 2 substantially plays the role of the source follower. For example, with the gains $G_1$ and $G_2$ of the source followers about equal to 0.9, the following relation $$V_{out} = G_1 \cdot V_{sig}$$

holds in the first stage source follower, so that $$V_p \approx G_2 \cdot G_1 \cdot V_{sig}$$

and hence it may be seen that the potential $V_p$ at the drain of the nMOS transistor 1 is changed in phase with the input voltage $V_{sig}$. Thus the gate-to-drain capacitance $C_{GD}$ of the nMOS transistor 1 is equivalently reduced and assumes a small value equal to 15 to 30% of the previous values. In this manner, the charge-to-voltage conversion gain may be improved, whereas the short channel effect is alleviated and the source follower gain is also improved.

Figure 4:
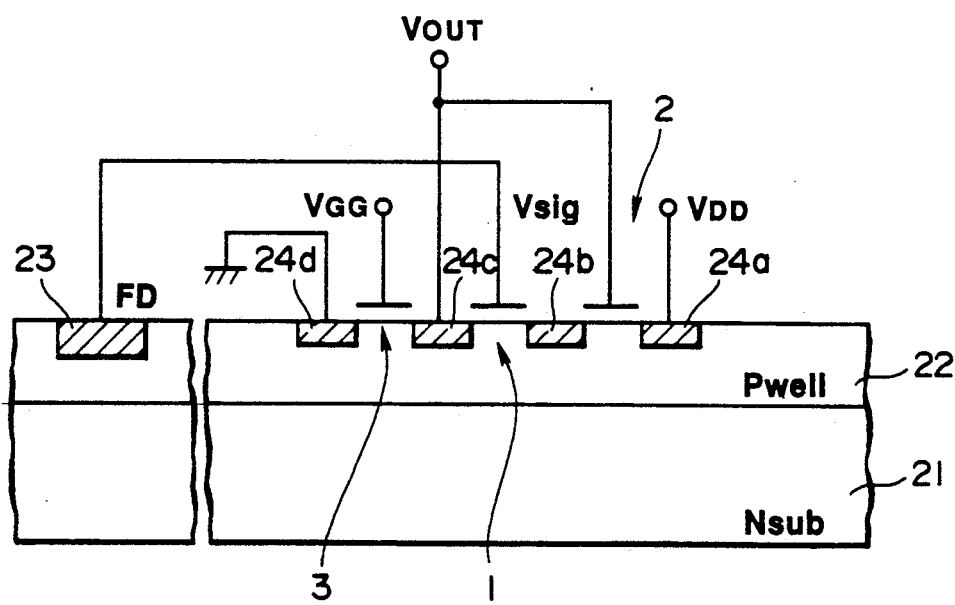
FIG. 4 is a cross-sectional view showing the output circuit of FIG. 3 formed on a substrate.

FIG. 4 shows in cross-sectional view a first stage source follower of the output circuit of the present embodiment formed on a chip. A p-type well region 22 is formed on an n-type silicon substrate, and a floating diffusion region 23 consisting of an n-type impurity diffusion region is formed on the p-type well region 22. In the p-type well region 22, there are formed n-type high concentration impurity diffusion regions 24a to 24d, in self-alignment with the gate electrode, with the n-type high concentration impurity diffusion regions 24a, 24b proving to be the drain and the source of the depletion type nMOS transistor 2, the n-type high concentration impurity diffusion regions 24b, 24c proving to be the drain and the source of the nMOS transistor 1 and the n-type high concentration impurity diffusion regions 24c, 24d proving to be the drain and the source of the nMOS transistor 3 functioning as the constant current source. The n-type high concentration impurity diffusion region 24c proves to be the output section 6, the source voltage $V_{DD}$ is supplied to the n-type high concentration impurity diffusion region 24a and the ground voltage GND is supplied to the n-type high concentration impurity diffusion region 24d. With the present embodiment, the n-type high concentration impurity diffusion region 24c, functioning as the source of the nMOS transistor 1 constituting the source follower, is connected to the gate of the nMOS transistor 2, so that the gate-to-drain capacitance $C_{GD}$ of the nMOS transistor 1 is reduced.

Figure 5:
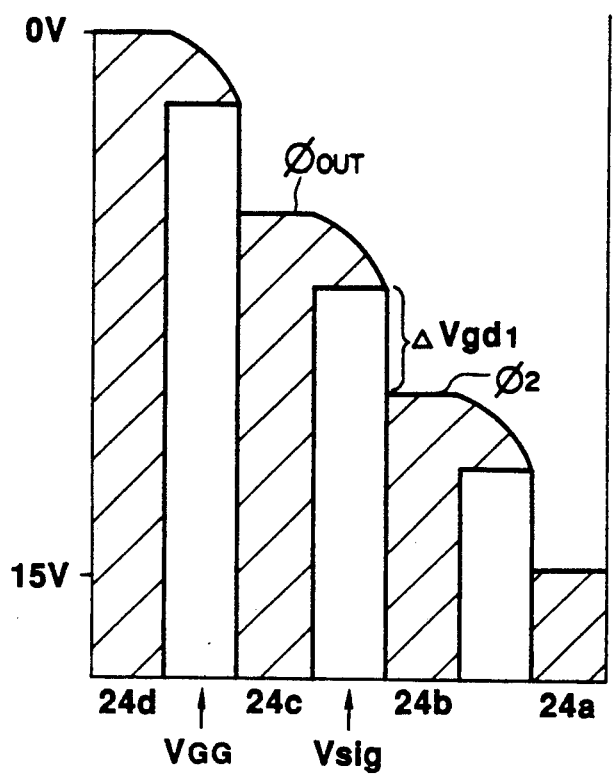
FIG. 5 shows a potential energy distribution along the cross-section of FIG. 4 with the source voltage $V_{DD}$ equal to 15 V.

FIG. 5 shows an electrical potential energy distribution along the cross-section of FIG. 4, wherein the source voltage $V_{DD}$ is about 15 V, the ground voltage GND is 0 V, the voltage $V_{GG}$ is of the order of 2.5 to 3.0 V and the center of the DC level of the input signal $V_{sig}$ is about 8.0 V.

In this figure, an output from the source follower is issued with changes in the potential $\phi_{OUT}$ in the high concentration impurity diffusion region 24c. Since the potential $\phi_2$ of the high concentration impurity diffusion region 24b is changed with the change is the potential $\phi_{OUT}$, and the changes in these potentials occur in phase with each other, a voltage difference $\Delta V_{gd1}$ shows only a minor change as compared with the case in which there lacks the nMOS transistor 2. Thus the gate-to-drain capacitance $C_{GD}$ of the nMOS transistor 1 is reduced to improve the charge-to-voltage conversion gain.

As regards the manufacture method, the depletion type nMOS transistor 2 may be formed by ion implantation, such as, for example, implantation of phosphorus ions, for adjusting the threshold voltage $V_{th}$. Since it is only sufficient if the mask of ion implantation employed for forming the buried channel in the customary CCD process is modified on the output circuit, there is no necessity of increasing the number of process steps.

Second Embodiment

The present embodiment is directed to a CCD output circuit in which the p-type well region is biased to the source potential.

Figure 6:
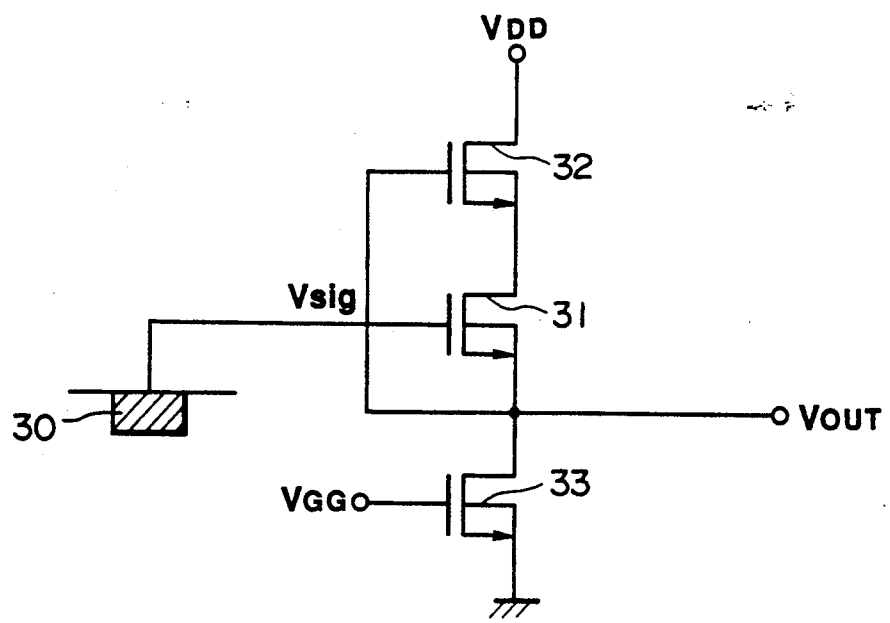
FIG. 6 is a circuit diagram showing a modified embodiment of the output circuit according to the present invention.

FIG. 6 shows the circuit organization of the output circuit wherein the floating diffusion region 30 is connected to the gate of the nMOS transistor 31 constituting a source follower. An nMOS transistor 33 functioning as the constant current source is connected between the source of the nMOS transistor 31 and the ground voltage GND. The gate of the nMOS transistor 33 is supplied with the constant potential $V_{GG}$. The depletion type nMOS transistor 32 has its gate connected to the source of the nMOS transistor 31 functioning as the output of the source follower. The source voltage $V_{DD}$ is supplied to the drain of the nMOS transistor 32. This depletion type nMOS transistor 32 has its source connected to the drain of the nMOS transistor 31. Hence, by the operation of the nMOS transistor 32, the drain of the nMOS transistor 31 is controlled so as to be in phase with respect to the output voltage of the source follower, so that the gate-to-drain capacitance $C_{GD}$ of the nMOS transistor 31 is prevented from increasing.

With the output circuit of the present embodiment, the potentials of the wells of the nMOS transistors 31, 32 are set so as to be equal to the potential at the respective sources of these nMOS transistors. For this reason, the well potential and the source potential are in phase with each other so that the channel-to-well capacitance is equivalently reduced to prevent the gain from being lowered.

Figure 7:
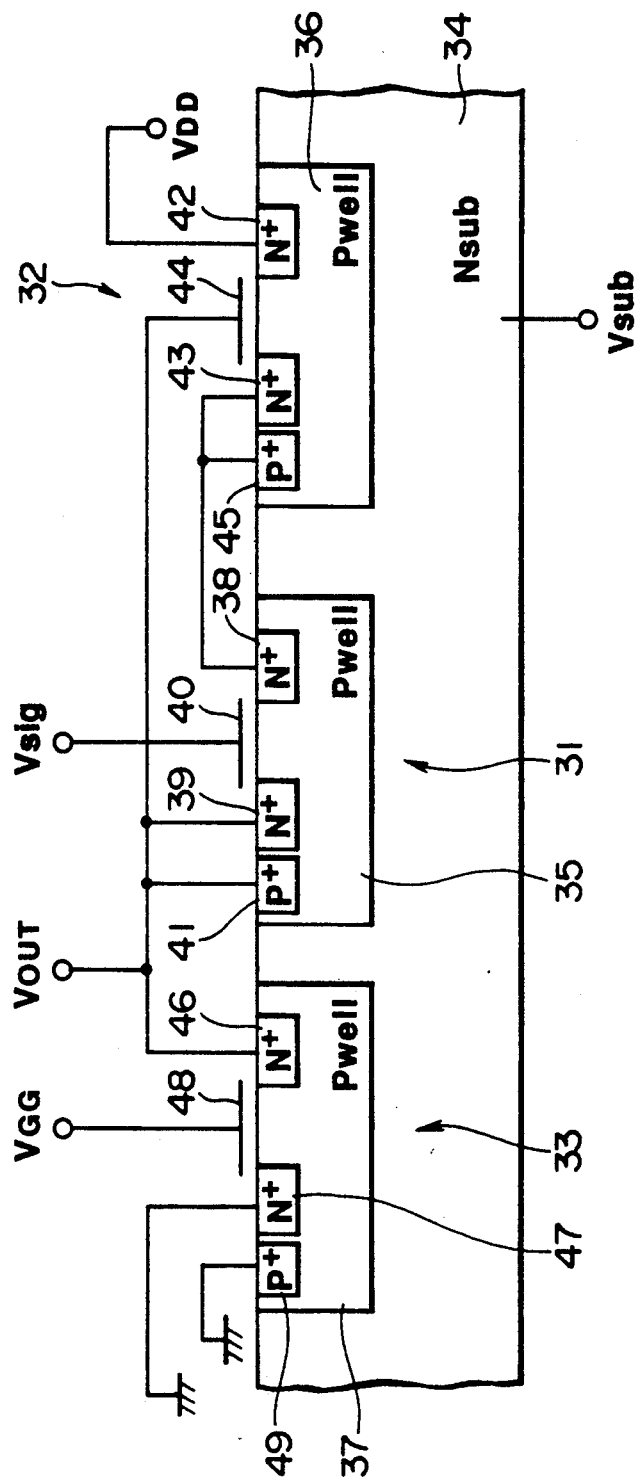
FIG. 7 is a cross-sectional view of the output circuit of FIG. 6 formed on a substrate.

FIG. 7 shows in cross-section the construction of the device according to the present embodiment. The nMOS transistor 31 to 33 are formed within p-type well regions 35 to 37, respectively, which are formed on the surface of an n-type silicon substrate 34 to which the substrate potential $V_{sub}$ is supplied.

More specifically, the nMOS transistor 31, from the source of which an output voltage $V_{out}$ is provided, has an n-type high concentration impurity diffusion region 38 within the p-type well region 35 as the drain and an n-type high concentration impurity diffusion region 39 as the source. The gate 40 of the nMOS transistor 31 is formed at an upper portion of a region between the n-type high concentration impurity diffusion regions 38, 39 and is supplied with input voltage $V_{sig}$. In the p-type well region 35, there is formed a plug-in region 41, which is a p-type high concentration impurity diffusion region 41 for affording a well potential and the same potential as that of the n-type high concentration diffusion region 39 is applied to this plug-in region 41.

The depletion type nMOS transistor 32, which is formed on the side source voltage $V_{DD}$ of the nMOS transistor 31, has an n-type high concentration impurity diffusion region 42 in the p-type well region 36 as the drain and an n-type high concentration diffusion region 43 in the p-type well region 36 as the source. The gate 44 of the transistor 32 is formed in an upper portion of a region between the n-type high concentration impurity diffusion regions 42, 43, and is connected to the n-type high concentration impurity diffusion region 39, which is the source of the nMOS transistor 31. The n-type high concentration impurity diffusion region 43 functioning as the source is connected to the n-type high concentration impurity diffusion region 38, functioning as the drain of the nMOS transistor 31, and is connected to a plug-in region 45 consisting of a p-type high concentration impurity diffusion region for affording the well region 36.

The nMOS transistor 33 as the constant current source has its drain formed by an n-type high concentration impurity diffusion region 46 formed in turn in a p-type well region 37, and its source connected to the ground potential GND formed by an n type high concentration impurity diffusion region 47 formed in turn in the well region 37. The drain of the nMOS transistor 33 is connected to the source of the nMOS transistor 31. The gate 48 of the nMOS transistor 33, supplied with the constant voltage $V_{GG}$, is formed on top of an between these n-type high concentration impurity diffusion regions 46, 47. A plug-in region 49 consisting of an n-type high concentration impurity diffusion region is formed in the well region and supplied with the ground voltage GND.

With the above described output circuit, the potential of the n-type high concentration impurity diffusion region 38, functioning as the drain of the nMOS transistor 31, is changed in phase with input voltage $V_{sig}$, owing to the function of the nMOS transistor 32, to the gate 44 of which the output voltage $V_{out}$ is input. As a result, the gate-to-drain capacitance $C_{GD}$ of the nMOS transistor 31 is reduced. With the output circuit of the present illustrative embodiment, the plug-in regions 41, 45, 49 of the well regions 35, 36, 37 are connected to the source of the nMOS transistors 31, 32, 33, respectively. Thus the substrate potential or well potential may be changed in phase with the source potential to reduce the channel-to-well parasitic capacitance to prevent the gain from being lowered.

Third Embodiment

The present third embodiment is a modification from the first embodiment and has a circuit organization in which a resistor is provided at the ground side terminal of the constant current source.

Figure 8:
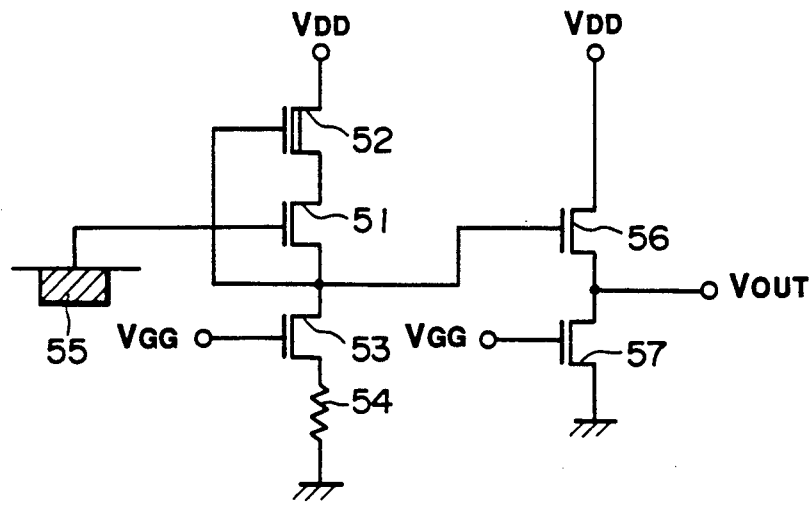
FIG. 8 is a circuit diagram showing another modified embodiment of the output circuit of the present invention.

FIG. 8 shows the circuit organization, wherein an nMOS transistor 51, which is a first MIS transistor, has its gate connected to a floating diffusion region 55, with the source of the transistor 51 functioning as an output section for outputting to the next stage source follower. The source of this nMOS transistor 51 is also connected to the gate of an nMOS transistor 52, a depletion type second MIS transistor, and to the drain of an nMOS transistor 53, functioning as the constant current source. The depletion type nMOS transistor 52 has its drain supplied with the source voltage $V_{DD}$, and has its source connected to the drain of the nMOS transistor 51. Thus the gate-to-drain capacitance $C_{GD}$ of the nMOS transistor 51 may be lowered. The nMOS transistor 53 functioning as the constant current source has its gate supplied with the constant voltage $V_{GG}$ and has its source supplied with the ground potential GND via resistor 54. The next stage source follower is constituted by an nMOS transistor 56 and an nMOS transistor 57 functioning as a constant current source.

With the output circuit of the present embodiment, since the resistor 54 is connected between the nMOS transistor 53 and the ground voltage GND, changes in the constant current caused by noises occasionally contained in the constant voltage $V_{GG}$ may be absorbed to maintain the constant current value. The gate-to-drain capacitance $C_{GD}$ of the nMOS transistor 51 may naturally be lowered, similarly to the above embodiment.

In the present embodiment, the source potential may be rendered equal to the substrate or well potential, similarly to the second embodiment.

Fourth Embodiment

With the output circuit of the fourth embodiment, input charges of the output circuit of the first embodiment are taken out via the floating gate.

Figure 9:
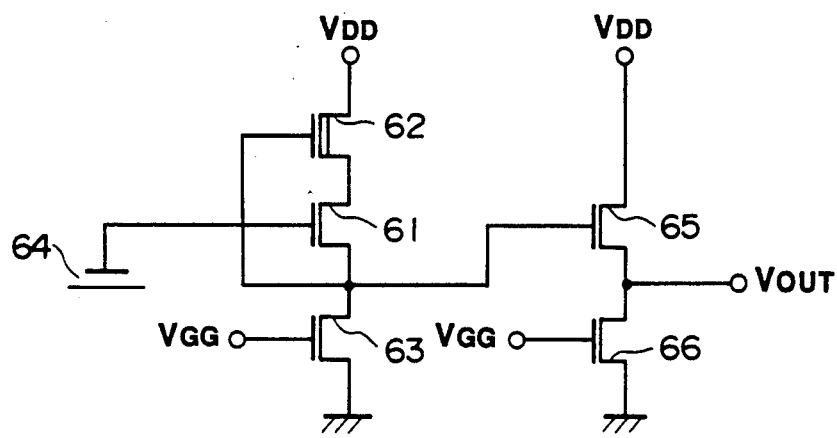
FIG. 9 is a circuit diagram showing a further modified embodiment of the output circuit of the present invention.

FIG. 9 shows a circuit organization wherein an nMOS transistor 61, which is a first MIS transistor, has its gate connected to a floating gate 64, from which input charges are transferred to the gate of nMOS transistor 61. This nMOS transistor 61 constitutes a source follower, the output of which is provided from its source. This source is supplied with the ground voltage GND via nMOS transistor 63 as the constant current source, and is connected to the gate of a depletion type nMOS transistor 62. This depletion type nMOS transistor 62 has its drain supplied with the source voltage $V_{DD}$ and has its source connected to the drain of the nMOS transistor 61 constituting the source follower. The next stage source follower is constituted by an nMOS transistor 65 and an nMOS transistor 66.

With the above described arrangement of taking out input charges at the floating gate 64, the drain potential of the nMOS transistor 61 is changed by the depletion type nMOS transistor 62 in phase with the input charges, as a result of which the gate-to-drain capacitance $C_{GD}$ of the nMOS transistor 61 may be reduced. With the above arrangement, the substrate or well potential may be made equal to the source potential of each of the nMOS transistors.

Fifth Embodiment

With the present fifth embodiment, input charges are provided from a floating gate and a resistor is connected in series with the constant current source.

Figure 10:
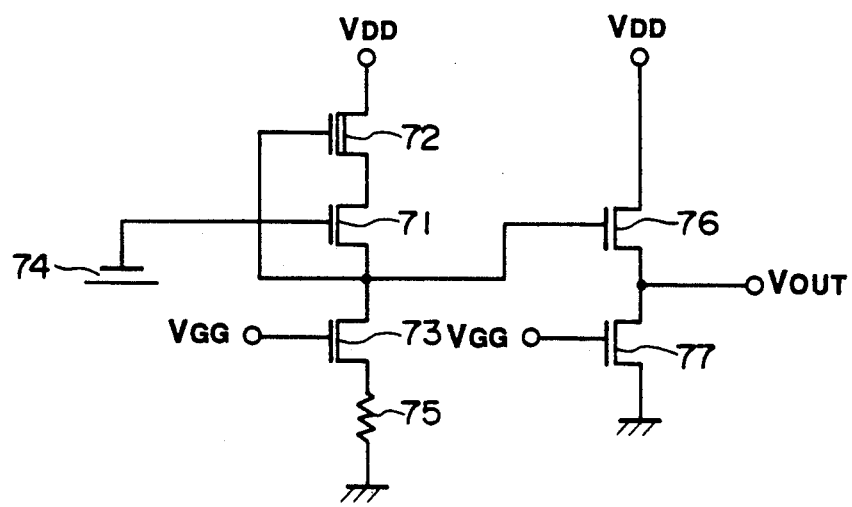
FIG. 10 is a circuit diagram showing a still further modified embodiment of the output circuit of the present invention.

FIG. 10 shows the circuit arrangement, wherein an nMOS transistor 71, which is a first MIS transistor, has its gate connected to a floating gate 74, from which input charges are transferred to the gate of the nMOS transistor 71. This nMOS transistor 71 constitutes a source follower, the output of which is taken out at its source. An nMOS transistor 73 as a constant current source and a resistor 75 are connected in series between the source of the transistor 71 and the ground voltage GND to suppress any adverse affects due to noises occasionally contained in the constant voltage $V_{GG}$. The nMOS transistor 71 has its source connected to the gate of a depletion type nMOS transistor 72. This depletion type nMOS transistor 72 has its drain supplied with the source voltage $V_{DD}$ and has its source connected to the drain of the nMOS transistor 71 constituting a source follower. Thus the gate-to-drain capacitance $C_{GD}$ of the nMOS transistor 71 may be lowered. The next stage source follower is constituted by an nMOS transistor 76 and an nMOS transistor 77 as the constant current source.

With the above described arrangement of taking out input charges and providing the resistor in series with the constant current source, the gate-to-drain capacitance $C_{GD}$ may be reduced.

What is claimed is:

1. An output circuit for converting input charges into an electrical voltage signal and outputting the converted voltage signal, comprising
   a first MIS transistor constituting a source follower and having its gate supplied with input electrical charges,
   an output section of said source follower which is the source of said first MIS transistor and from which said converted voltage signal is output and
   a depletion type second MIS transistor connected between the drain side of said first MIS transistor and an electrical source and having its gate connected to said output section.

2. A charged coupled device comprising
   a semiconductor substrate,
   a charge transfer section formed on said semiconductor substrate,
   charge extracting means formed on said semiconductor substrate and at the end of said charge transfer section, and
   an output circuit formed on said semiconductor substrate and adapted for amplifying electrical charges from said charge extracting means,
   said output circuit including a first stage buffer comprising
   a first MIS transistor constituting a source follower and having its gate supplied with input electrical charges,
   an output section of said source follower which is the source of said first MIS transistor and from which said converted voltage signal is output, and
   a depletion type second MIS transistor connected between the drain side of said first MIS transistor and an electrical source and having its gate connected to said output section.

3. The charge coupled device according to claim 2 wherein said charge extracting means is a floating diffusion.

4. The charge coupled device according to claim 2 wherein said charge extracting means is a floating gate.

5. The charge coupled device according to claim 2, wherein
   a source voltage is applied to the drain of a second MIS transistor, a ground voltage is supplied to the source of said first MIS transistor via a constant current source and wherein said first and second MIS transistors each have a structure of an n-channel MOS transistor.

6. An output circuit for converting input charges into an electrical voltage signal and outputting the converted voltage signal, comprising
   a first MIS transistor constituting a source follower and having its gate supplied with input electrical charges.
   an output section of said source follower which is the source of said first MIS transistor and from which said converted voltage signal is output,
   a depletion type second MIS transistor connected between the drain side of said first MIS transistor and an electrical source and having its gate connected to said output section,
   a constant current source connected to the source of said first MIS transistor, and
   a load connected between said constant current source and a reference voltage line.

7. An output circuit for converting input charges into an electrical voltage signal and outputting the converted voltage signal, comprising
   a first MIS transistor constituting a source follower and having its gate supplied with input electrical charges.
   an output section of said source follower which is the source of said first MIS transistor and from which said converted voltage signal is output, and
   a depletion type second MIS transistor connected between the drain side of said first MIS transistor and an electrical source and having its gate connected to said output section,
   whereby the substrate potential of said first MIS transistor and/or said second MIS transistor is equal to the source potential of each of said MIS transistors.

8. A charge coupled device comprising
   a semiconductor substrate of a first conductivity type,
   a charge transfer section formed in a well region of a second conductivity type in said semiconductor substrate,
   charge extracting means formed on said semiconductor substrate and at an end of said charge transfer section, and
   an output circuit formed on said semiconductor substrate and adapted for amplifying electrical charges from said charge extracting means,
   said output circuit including a first stage buffer comprising
   a first MIS transistor having a channel of a first conductivity type, said first MIS transistor being formed in a first well region of a second conductivity type and having its gate supplied with input electrical charges, said first well region being set to an electrical potential equal to that of its source, an output section of said source follower which is the source of said first MIS transistor and from which an output converted into an electrical voltage is provided, and a depletion type second MIS transistor having a channel of a first conductivity type, said second MIS transistor being formed in a second well region of a second conductivity type between the drain side of said first MIS transistor and an electrical source and having its gate connected to said output section, said second well region being set to an electrical potential equal to that of its source.

9. The charge coupled device according to claim 8 wherein a constant current source constituting the source follower is constituted by a MIS transistor having a channel of a first conductivity type, said MIS transistor being formed in a well region of a second conductivity type distinct from said well regions of the second conductivity type having said first and second MIS transistors.

* * * * *